(12) United States Patent
Mobin et al.

(10) Patent No.: US 6,532,273 B1
(45) Date of Patent: Mar. 11, 2003

(54) EFFICIENT POLYPHASE DECIMATION FILTER

(75) Inventors: Mohammad Shafiul Mobin, Whitehall, PA (US); Marta Rambaud, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/195,987

(22) Filed: Nov. 19, 1998

(51) Int. Cl.[7] .............................. H03H 7/30; G06F 7/38
(52) U.S. Cl. ...................... 375/350; 708/313; 708/316
(58) Field of Search ................................ 375/350, 232, 375/233; 708/313, 316, 319, 322; 341/61

(56) References Cited

U.S. PATENT DOCUMENTS

| | | | | |
|---|---|---|---|---|
| 4,777,612 A | * | 10/1988 | Tomimitsu | 708/316 |
| 4,852,035 A | * | 7/1989 | Michener | 708/313 |
| 5,249,578 A | * | 10/1993 | Karp et al. | 600/447 |
| 5,517,529 A | * | 5/1996 | Stehlik | 375/316 |
| 6,169,767 B1 | * | 1/2001 | Strolle et al. | 375/302 |
| 6,229,927 B1 | * | 5/2001 | Schwartz | 382/248 |

* cited by examiner

*Primary Examiner*—Young T. Tse
(74) *Attorney, Agent, or Firm*—William H. Bollman

(57) ABSTRACT

An efficient polyphase half rate finite impulse response (FIR) filter module includes an odd/even sample delay line. The odd/even sample delay line includes two parallel paths of delays corresponding respectively to odd and even sample processing, i.e., every other sample. A first input sample is presented to the first register phase in the odd/even sample delay line and is fed directly to the third register phase bypassing the second register phase, the third register phase feeds directly into the fifth register phase, and so on until the ninth register phase of the odd/even sample delay line feeds directly into the eleventh register phase bypassing the tenth register phase. A second input sample skips over the first register phase and is presented directly to the second register phase in the odd/even sample delay line. Thereafter, the second register phase feeds directly to the fourth register phase, and so on until the tenth register phase of the odd/even sample delay line feeds directly into the twelfth register phase bypassing the eleventh register phase. A plurality of polyphase half rate filters may be serially combined to provide the desired decimation rate. The bit width of sub-products in a polyphase math logic module is reduced from that in conventional FIR filter math logic modules to allow faster clocking of the FIR filter.

27 Claims, 12 Drawing Sheets

HR STAGE BUFFER MANAGEMENT

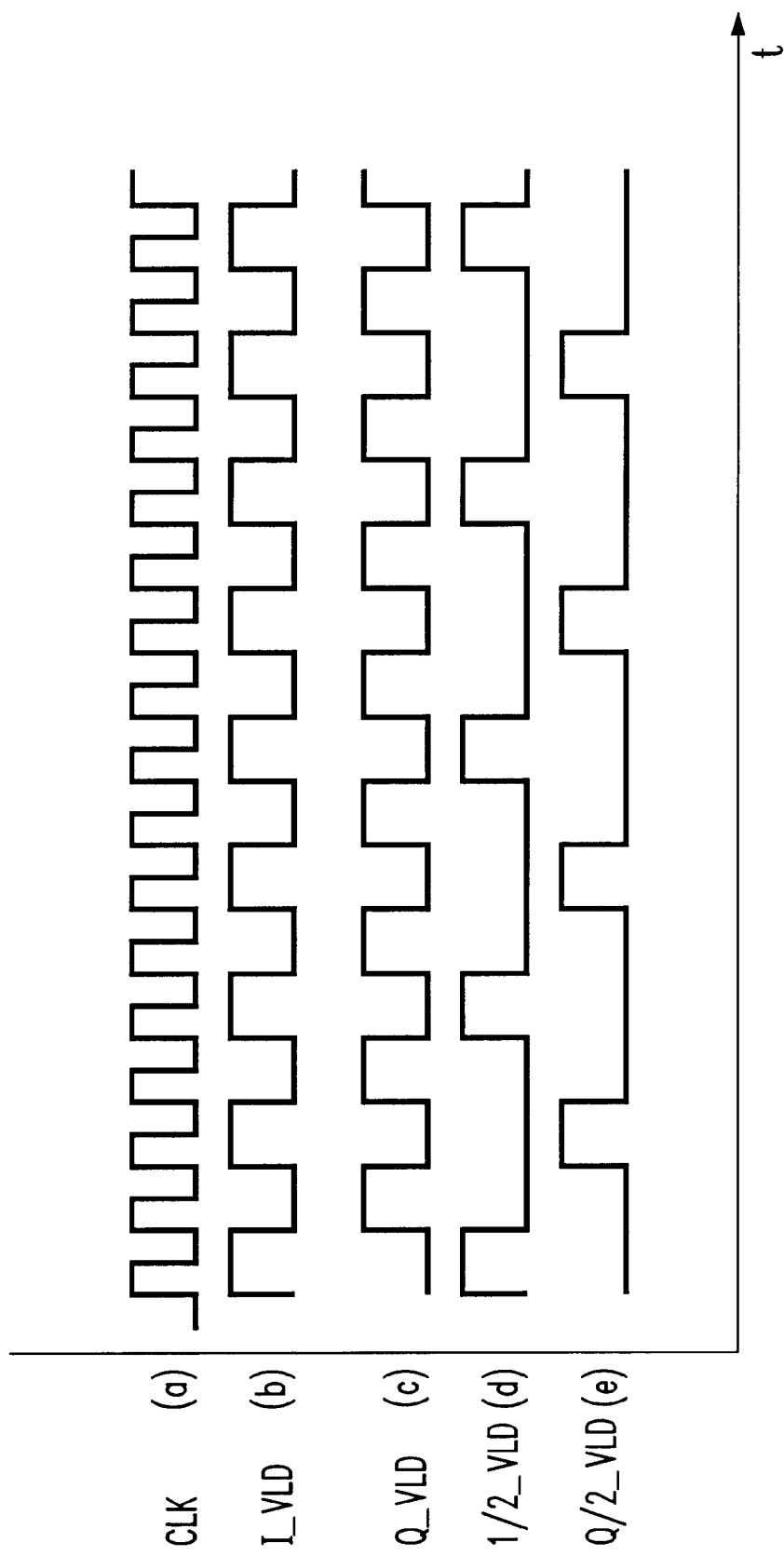

Q/2_VLD IS ONE CYCLE DELAYED
FROM Q_VLD EXTRACTED

EFFICIENT POLYPHASE DECIMATION FILTER

BACKGROUND OF THE INVENTION

1. Field of the Invention

This invention relates generally to digital filtering. More particularly, it relates to an efficient decimation filter architecture and method for particular use with polyphase input samples such as quadrature samples.

2. Background of Related Art

Meeting timing constraints in very large scale integration (VLSI) design is a major challenge for today's high speed communications receivers. As speeds increase, less time is available to perform given tasks. This is particularly true in the case of digital filtering.

For instance, a conventional half rate finite impulse response (FIR) digital filter 600 is depicted in FIG. 6. The 'half rate' of the shown FIR filter 600 refers to the decimation of an input data rate by one half with respect to an output data rate.

FIG. 7 shows a block diagram of the half rate FIR filter 600 shown in FIG. 6.

In particular, a conventional FIR filter includes a delay chain 699, a uniphase math logic module 620, and filtered (i.e., decimated) output samples 630.

As is conventionally known, the delay chain 699 comprises twelve individual register or storage phases 601–612 each corresponding to a delay in an input sample. In operation, samples are input to the first register 601 and ripple serially through the delay chain 699 until exiting the last, twelfth register phase 612. Thus, samples input to the first register 601 eventually ripple through the delay chain 699 toward the last register 612 as new samples are input to the delay chain 699.

The values stored in each of the registers 601 through 612 during any particular sample cycle are input to a uniphase math logic module 620. The uniphase math logic module 620 performs the additions and multiplications necessary to perform a finite impulse response filtering function. The results of the mathematics performed in the uniphase math logic module 620 are registered and output as decimated output samples 630.

FIG. 8 shows a more detailed schematic of the FIR filter 600 shown in FIGS. 6 and 7.

In particular, FIG. 8 shows that each register 601–612 is comprised of two sets of serially connected registers or storage elements clocked by a data clock. Each register latches input data at an input terminal D when enabled and clocked, and outputs that data when clocked by the system clock signal. Each register 601–612 is enabled when a particular logic level (e.g., logic high) is present on its respective enable E input.

The conventional FIR filter 600 is adequate for low speed operations, e.g., less than about 50 megahertz (MHz), but experiences deteriorated performance at high speeds. This is most notably because of the limitations in sample width caused by the maximum number of bits which can ripple through any particular serial element, e.g., an adder within any given period of time.. For instance, as speeds approach 75 MHz and the. corresponding cycle time approaches about 13 nanoseconds (nS), sufficient time is not available for all of the bits of a larger sample or subproduct to ripple through from a most significant bit (MSB) to a least significant bit (LSB), or from an LSB to an MSB.

For instance, based on these speeds and presuming it takes about 1 nS or so for each bit in a multiple serial bit element such as an adder to ripple any carry and/or sign bits, and thus the FIR filter 600 becomes limited to a sample or product size corresponding to the amount of time available, e.g., to about 13 bits corresponding to the available 13 nS if operated at 75 MHz. Unfortunately, subproducts in a conventional FIR filter 600 such as is shown in FIGS. 6 to 8 may become lengthy, e.g., 27 bits as shown at 802, 804 in FIG. 8, and will thus not be capable of rippling through all 27 bits in the adder function 806 at such high clock speeds. Accordingly, as speeds increase, FIR filtering becomes limited in sample and subproduct length and thus eventually becomes quite limited using conventional technology.

There is thus a need for an architecture and method of FIR filtering which is capable of operation at higher speeds, e.g., speeds in excess of 75 MHz.

SUMMARY OF THE INVENTION

In accordance with the principles of the present invention, a digital filter comprises an odd/even digital delay line comprising a plurality of register phases, a first sub-plurality of every other one of the plurality of register phases receiving a first sample stream, and a second sub-plurality of the other every other one of the plurality of register phases receiving a second sample stream. The odd/even digital delay line alternates in a serial direction between one of odd and even register phases receiving samples from the first sample stream, and the other of the odd and even register phases receive samples from the second sample stream. A polyphase math logic module is adapted to receive samples from a plurality of tap points along the odd/even digital delay line.

A method of decimating a polyphase signal in accordance with the principles of the present invention comprises receiving a sample stream containing samples each based on one of a plurality of phases of a common signal. Odd samples in the sample stream are delayed in a first plurality of serially connected digital register phases, and even samples are delayed in the sample stream in a second plurality of serially connected digital register phases. The delayed odd samples and the delayed even samples are alternately filtered to provide a decimated polyphase signal.

BRIEF DESCRIPTION OF THE DRAWINGS

Features and advantages of the present invention will become apparent to those skilled in the art from the following description with reference to the drawings, in which:

FIGS. 4A and 4B are timing diagrams showing signals relevant to the detailed schematical diagram shown in FIGS. 3A–3C.

DETAILED DESCRIPTION OF ILLUSTRATIVE EMBODIMENTS

The present invention provides an efficient polyphase decimating filter (e.g., an FIR filter) which takes advantage of the alternating nature of a polyphase signal with interleaved I and Q signal elements of a complex sample signal, e.g., a quadrature signal containing both an I and a Q component. The embodiments disclosed related to modules which each provide a half rate decimation, and which can be combined to provide multiples of ½ rate decimation. For instance, while one disclosed half rate polyphase FIR filter provides decimation of ½, two of the half rate polyphase FIR filters connected in series would provide ¼ decimation, three would provide ⅛ decimation, and so on, to provide the desired decimation.

The disclosed half rate FIR filter includes an odd/even delay line which takes advantage of the alternating nature of polyphase (e.g., quadrature) signal samples by including a bypass mode delayed signal feeding mechanism. Thus, either odd or even samples are presented to a first register phase in the delay line, while the other of the odd or even samples are presented directly to the second register phase in the delay line bypassing the first register phase. For example, samples are presented to the first (i.e., odd) register phase only every other sample, while the alternating samples are presented directly to the second register phase on the opposite set of every other sample. In this way, one phase of an interlaced polyphase sample signal, e.g., I odd samples in a quadrature modulation based signal, can be presented to odd register phases only while another phase of the polyphase sample signal, e.g., Q even samples, can be presented to even register phases only.

Consequently, bit paths are minimized for polyphase signals allowing higher data rates at higher speeds than is conventionally permitted by existing filtering circuits, without increasing circuit area and/or without increasing power requirements.

Figure 1:
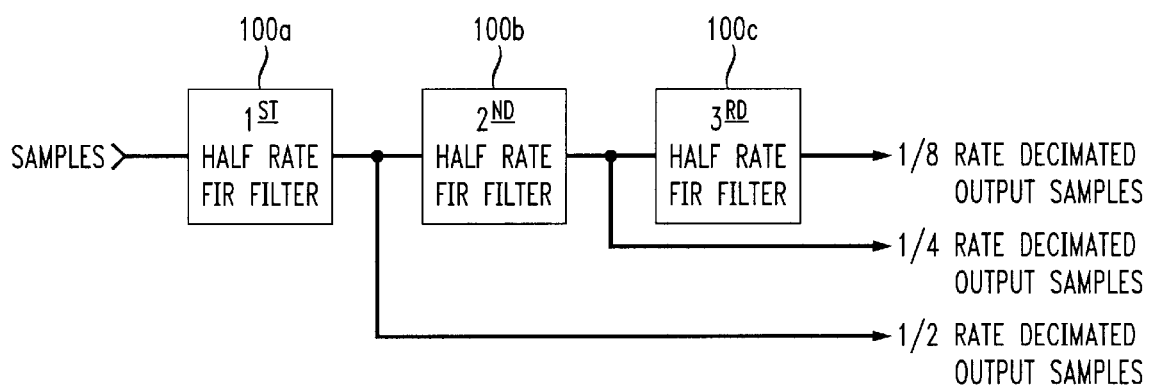
FIG. 1 depicts a programmable rate FIR filter capable of high speed filtering operation, e.g., speeds in excess of 75 MHz, on polyphase samples, in accordance with the principles of the present invention.

FIG. 1 shows an embodiment of a programmable rate FIR filter capable of high speed FIR filtering with a decimation rate of ½, ¼ or ⅛, in accordance with the principles of the present invention. Although the polyphase FIR filter shown in FIG. 1 provides programmable selection of the rate of decimation by allowing the use of just one polyphase half rate FIR filter 100a, just two polyphase half rate FIR filters 100a, 100b, or all three shown polyphase half rate FIR filters 100a–100c, the present invention relates equally to any number of polyphase FIR filters providing any level of decimation. Preferably, the decimation of each filter module is ½.

Figure 2:
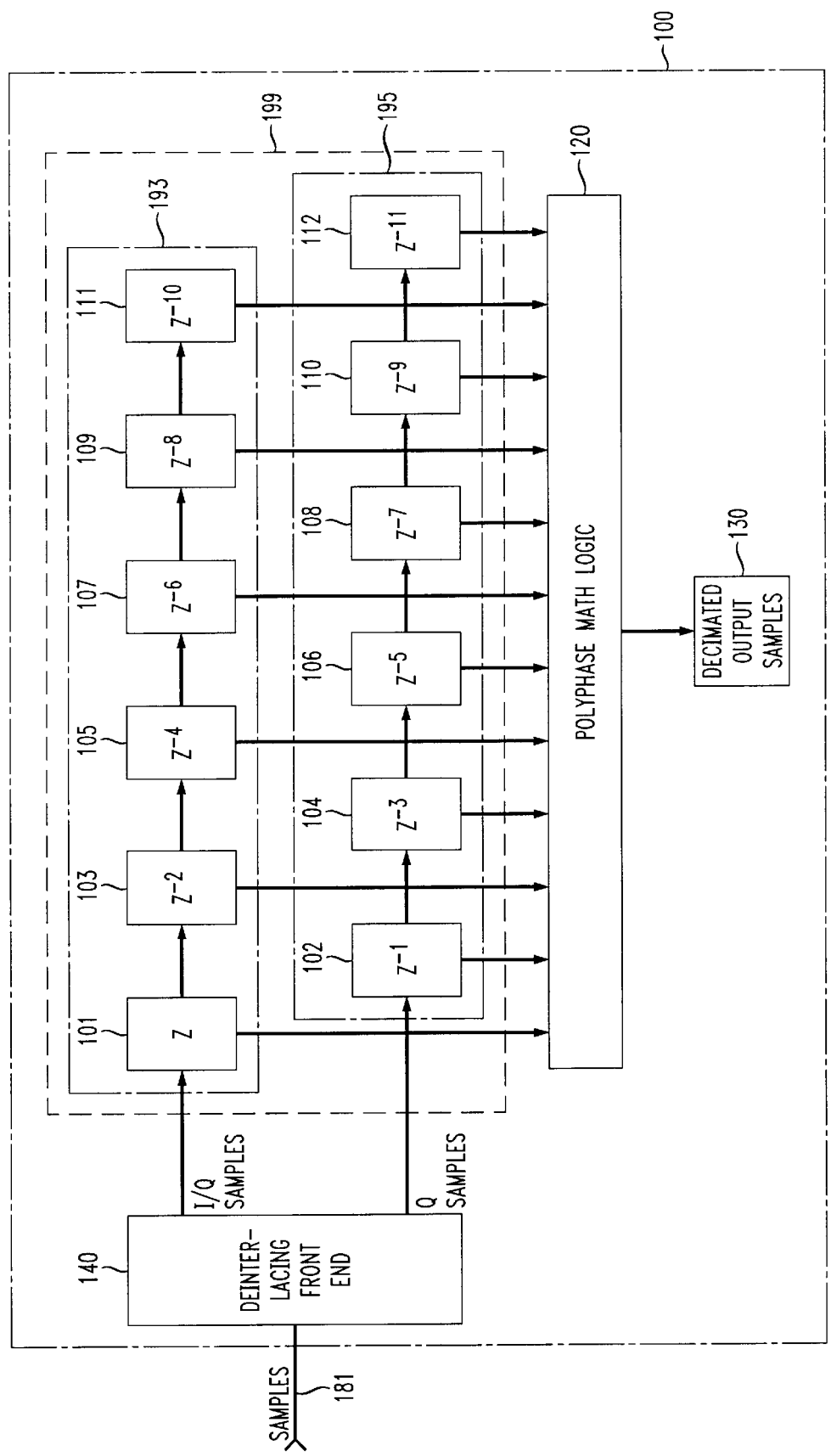
FIG. 2 is a block diagram of any one of the three half rate FIR filters shown in FIG. 1.

FIG. 2 is a block diagram showing any one of the three half rate FIR filters 100a, 100b or 100c shown in FIG. 1. Each of the three FIR filters 100a, 100b, 100c shown in FIG. 1 will each be referred to generically as the FIR filter 100 shown in FIG. 2.

The half rate FIR filter 100 shown in FIG. 2 includes a de-interlacing front end 140 providing multiple phases of an input signal, an bdd/even delay line 199, polyphase math logic 120, and decimated output samples 130. Although the front end 140 is shown as a de-interlacing front end, the principles of the present invention relate equally to the provision of appropriately timed phases of a signal along separate paths.

The disclosed odd/even delay line 199 includes twelve register phases 101–112. Each register phase 101–112 stores a delayed sample of the input signal 181 at a delayed pace relating to a specific sampling cycle. The odd/even delay line 199 includes an odd delay line 193 and an even delay line 195 which each pass signal samples from left to right with each new corresponding data sample as shown in FIG. 2. The odd delay line 193 propagates samples from register phase to register phase upon the presentation of odd numbered samples in a sequence, while the even delay line 195 propagates samples from register phase to register phase upon the presentation of even numbered samples in the sequence.

The polyphase math logic module 120 relates to the specific implementation of an FIR filter providing output samples 130 at a decimated rate of ½ with respect to the rate of the samples in the sample path 181.

Figure 3A:
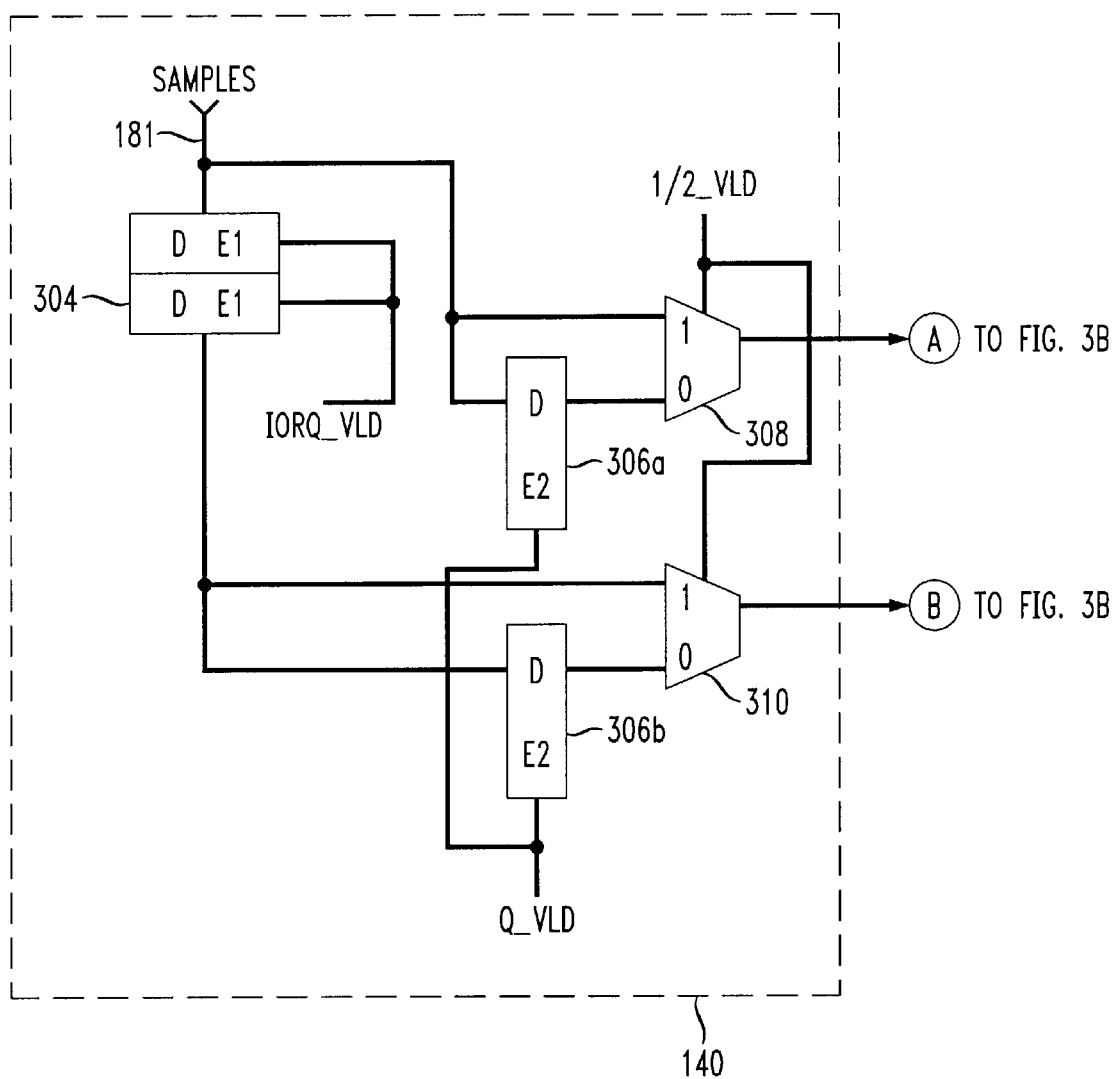
FIGS. 3A–3C show are detailed schematical diagrams of an efficient polyphase half rate FIR filter shown in FIGS. 1 and 2.
Figure 3B:
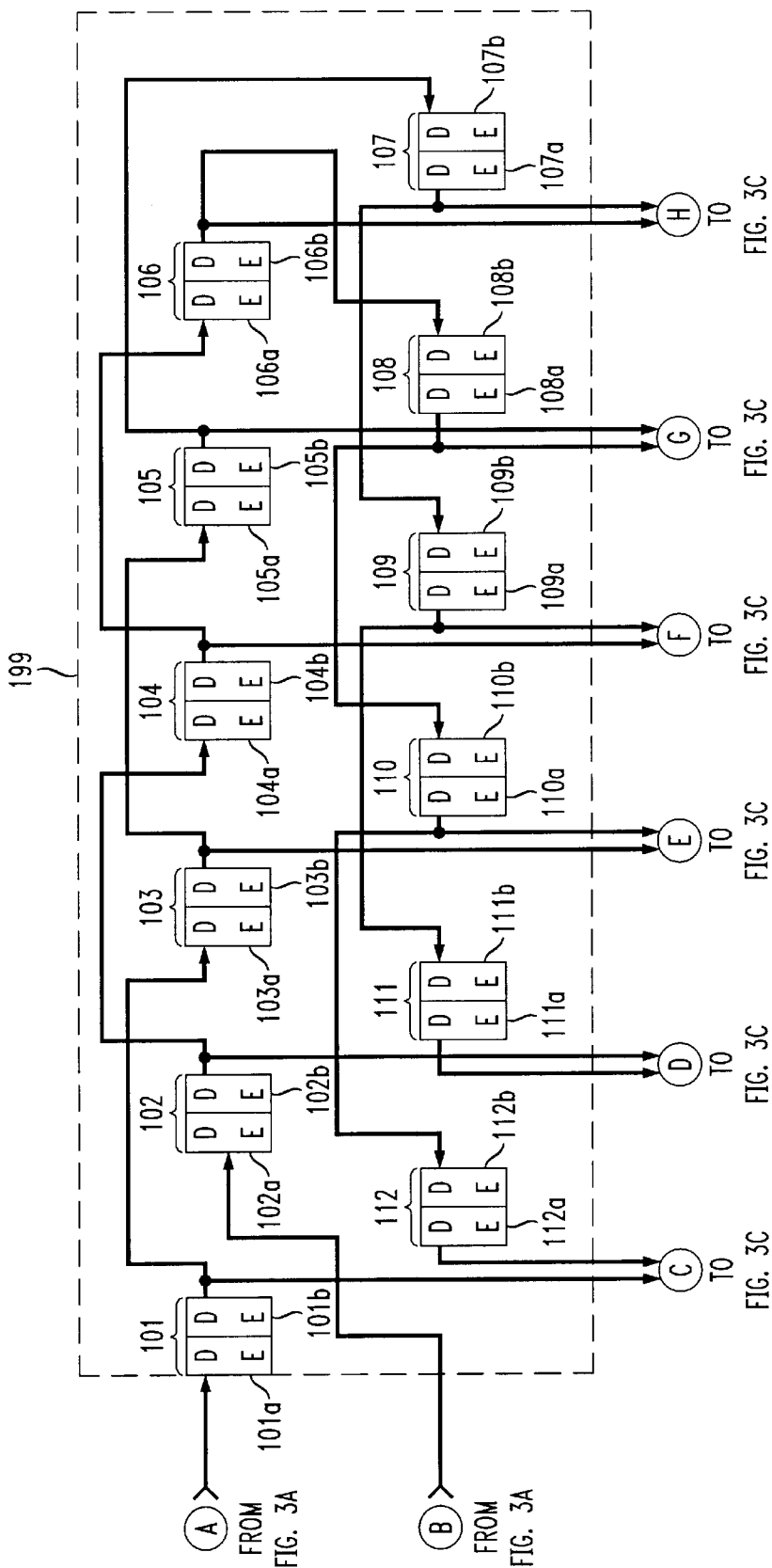
Figure 3C:
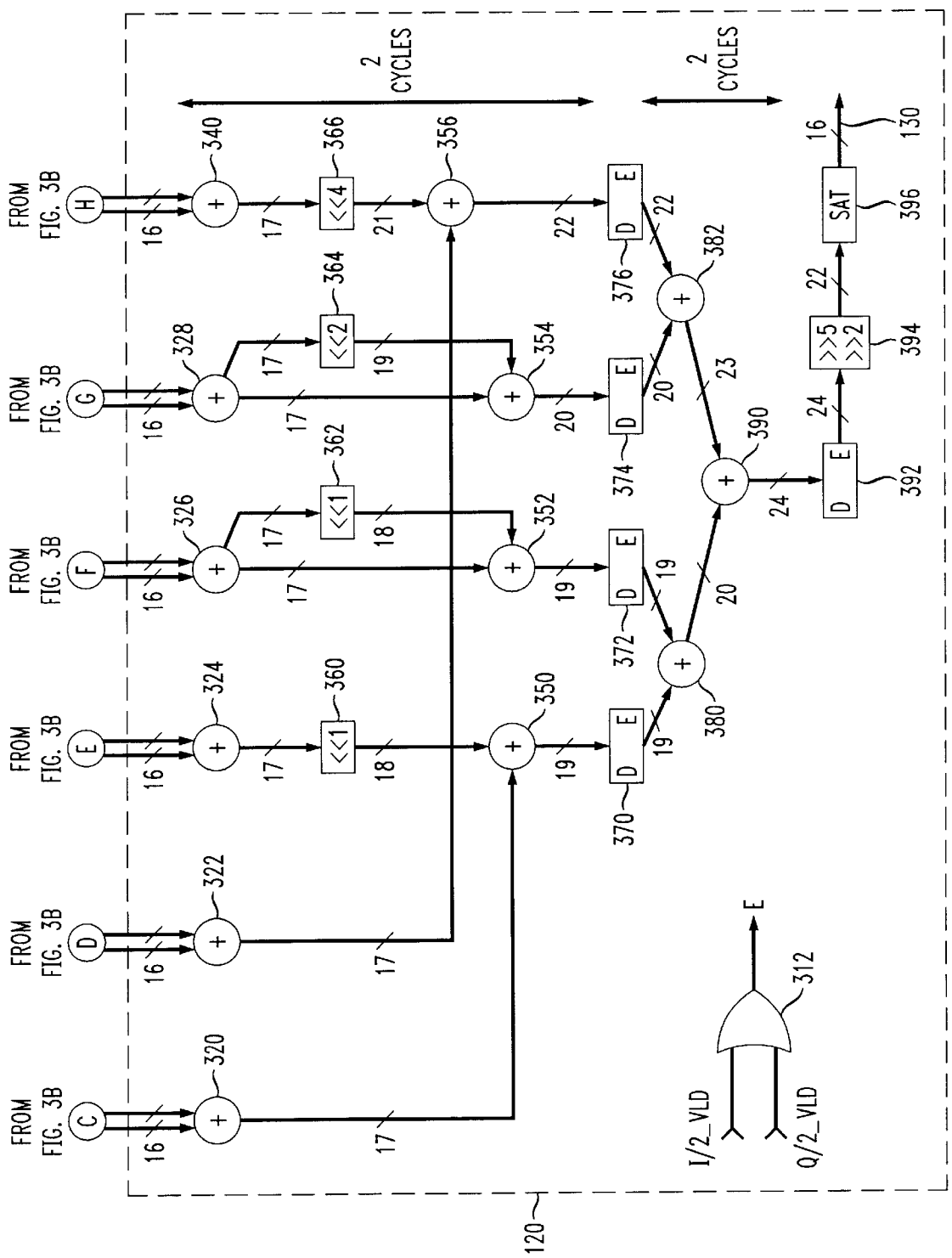

FIGS. 3A–3C are detailed schematical diagrams of an efficient polyphase half rate FIR filter shown in FIGS. 1 and 2, and FIGS. 4A and 4B are timing diagrams showing signals relevant to the detailed schematical diagram shown in FIGS. 3A–3C.

Figure 3D:
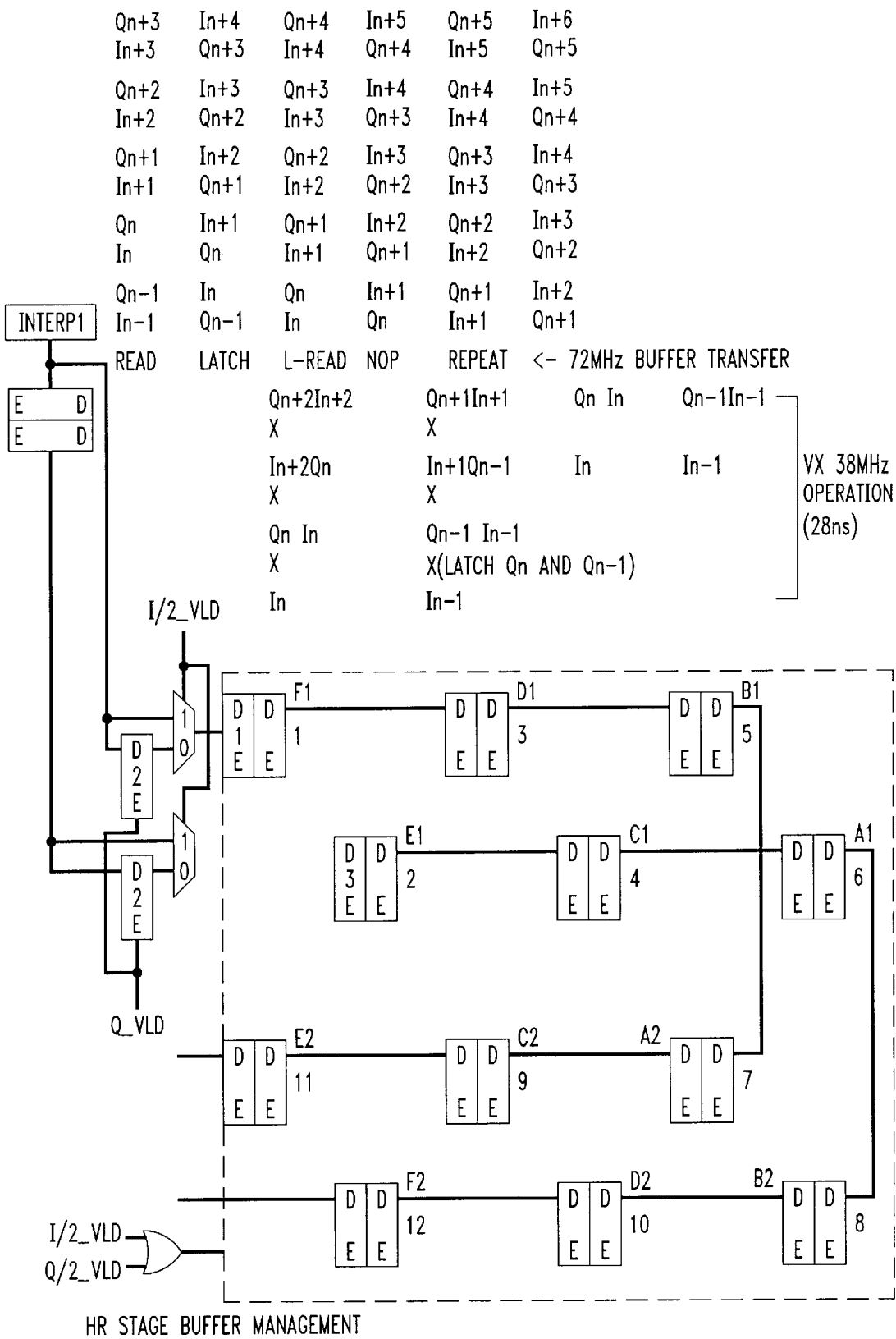
FIG. 3D depicts HR stage buffer management.
Figure 4B:
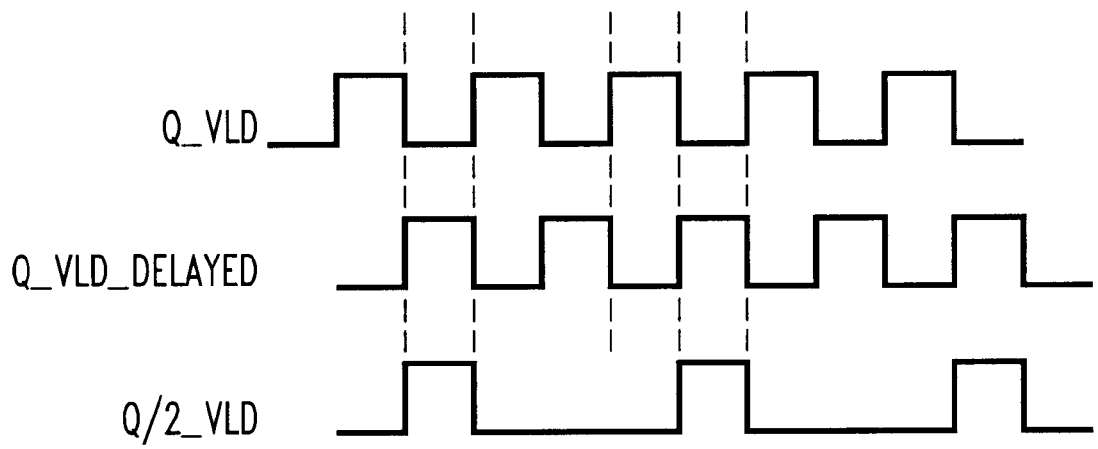

FIGS. 3A–3C show the de-interlacing front end 140, the delay line 199 including the odd delay line comprising registers 101, 103, 105, 107, 109 and 111, and the even delay line comprising registers 102, 104, 106, 108, 110 and 112. FIG. 3D also shows the polyphase FIR filter decimating math logic 120 in greater detail. It is important to note that the valid samples flowing through the de-interlacing front end 140 and/or FIR filter decimating math logic 120 may contain gaps. Although, as will be described later with reference to FIG. 4, that timing diagram explains a worst case scenario. However, system requirements may be relaxed such that gaps or 'empty periods' may exist between samples (e.g., in the I_VLD or Q_VLD signals) being processed by the filter, in accordance with the principles of the present invention.

In FIGS. 3A–3C, the de-interlacing front end 140 includes a first registering phase 304 comprising two serially connected registers clocked by the I or Q valid signal IORQ_VLD. The I or Q valid signal IORQ_VLD is based on an ORed combination of valid signals corresponding to the multiple phases contained in the sample stream 181, e.g., an I valid signal I_VLD and a Q valid signal Q_VLD as shown in waveforms (b) and (c) of FIG. 4A, respectively.

The de-interlacing front end 140 further comprises separate single register phases 306a, 306b feeding respective inputs of multiplexers (MUXs) 308 and 310. The separate single register phases 306a and 306b are enabled when a second phase of the polyphase sample signal 181, e.g., the Q phase, has valid data available as represented by a Q valid signal Q_VLD shown in waveform (c) of FIG. 4A. The MUXs 308 and 310 are controlled based on the validity of every other first phase of the polyphase sample signal 181, e.g., every other I sample as represented by an every other I sample signal I/2_VLD.

Figure 8:
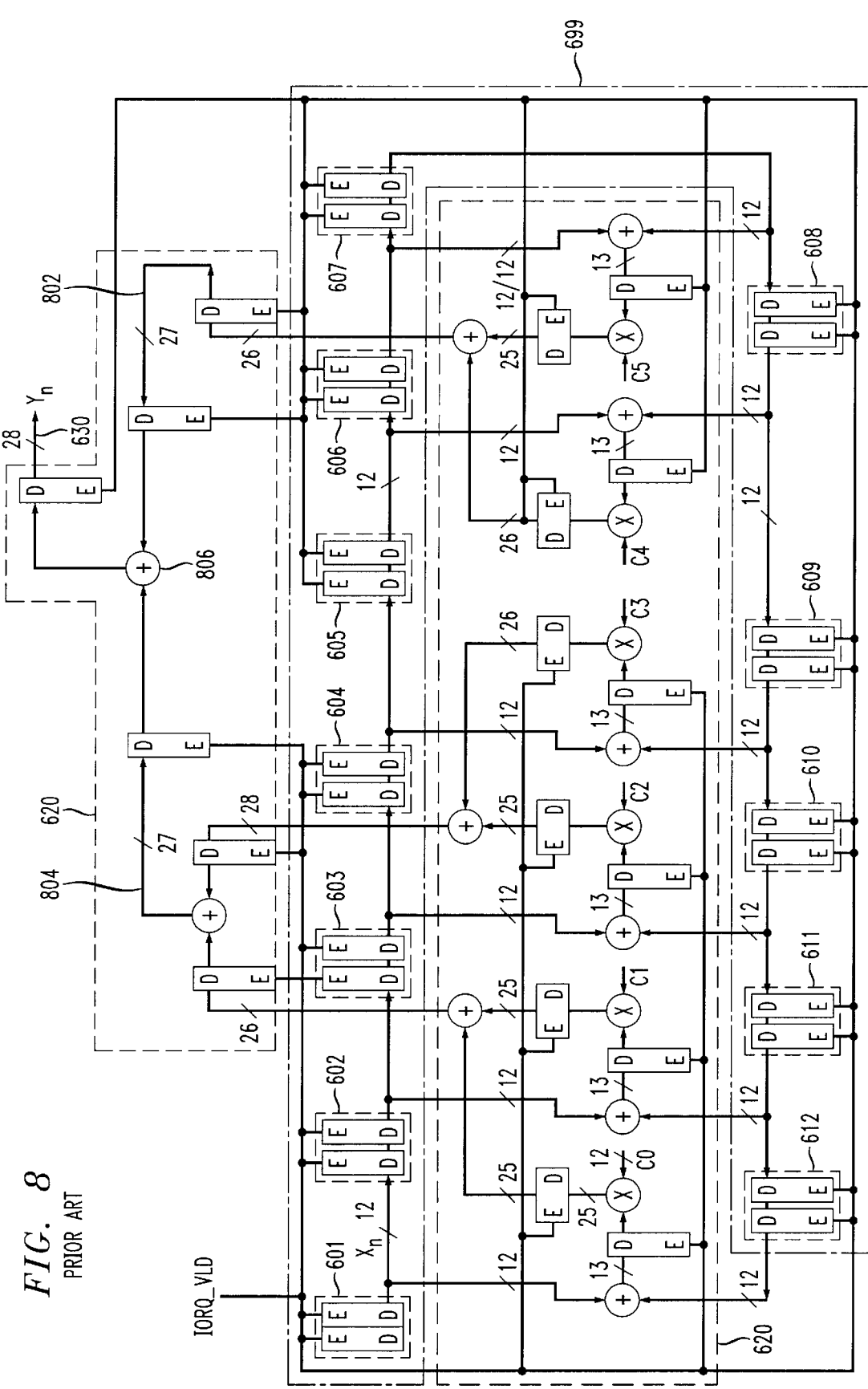
FIG. 8 shows a more detailed schematic of the half rate FIR filter shown in FIGS. 6 and 7.

The delay line shown in FIGS. 3B and 3C include twelve register phases 101–112 corresponding substantially to the twelve register phases 601–612 as shown in FIG. 8, but instead taking advantage of an interlaced input signal by providing parallel odd and even paths of six register phases each rather than a serial connection of all twelve register phases 601–612 as in the prior art.

To form an odd delay line 193, the output of the first, odd register phase 101 is provided directly to the third register phase 103 in the overall delay line 199, whose output is provided directly to the fifth register phase 105 in the overall delay line 199, and so on to the ninth register phase 109 whose output is provided directly to the eleventh register phase 111.

Similarly, the second MUX 310 of the de-interlacing front end provides even samples from the interlaced sample input 181 directly to the second register phase 102 of the overall delay line 199. Moreover, to provide an even delay line 195, the output of the first even register phase is fed to the input of the fourth register phase 104, and so on to the tenth register phase 110 whose output is provided directly to the twelfth register phase 112.

The following three cycle operation will serve as an example to explain the operation of the de-interlacing front end 140 and the polyphase FIR filter decimating math logic 120 shown in FIGS. 3A–3C.

(1) At time t, In and In−1 go to the delay line registers 101a and 102a through the multiplexers 308, 310 using I/2_VLD.

(2) At time t+1, Qn and Qn−1 will be stored in the queue registers 306a and 306b with Q_VLD.

(3) At time t+2, In and In−1 move to the next register 101b, 102b, respectively. Consequently, they are operated on by the filter. Also at this time, Qn and Qn−1 move to registers 101a and 102a. These cycles repeat continuously as samples come through.

FIG. 3D depicts the buffer management in more detail.

This three cycle operation essentially makes use of an extra cycle between I filtering and Q filtering. One benefit of the use of this 'extra' cycle is overall conservation of power as operations are not performed on samples which are to be discarded. Another benefit is a time relaxation because two cycles are available to operate on one sample.

All register phases 101–112 shown in FIGS. 3A–3C are clocked using a data clock, e.g., as shown in waveform (a) of FIG. 4A. Moreover, all twelve register phases 101–112 in the delay line 199 are enabled by a logical OR 312 of an every other I valid signal I/2_VLD (shown in waveform (d) of FIG. 4A) and an every other Q valid signal Q/2_VLD (shown in waveform (e) of FIG. 4A). These signals relate to every other valid I phase sample and every other valid Q phase sample, respectively.

Each of the twelve register phases 101–112 comprise two layers of registering, each layer being clocked by the data clock signal shown in waveform (a) of FIG. 4A when enabled. The respective outputs of the second layer of registering in each of the twelve register phases 101–112 is input to a respective one of six adders 320, 322, 324, 326, 328 and 340.

The sample width in the disclosed example is 16 bits. However, the principles of the present invention relate equally to samples having larger or smaller bit widths.

In the polyphase math logic module 120, the 16 bit outputs of the first registering phase (i.e., the first odd register phase) 101 and of the twelfth registering phase (i.e., the last even register phase) 112 are added in an adder 320 to provide a 17 bit sample to another adder 350. Similarly, the outputs of the first even register phase 102 and of the last odd register phase 111 are added together in adder 322, the outputs of the second odd register phase 103 and of the fifth even register phase 110 are added together in adder 324, the outputs of the second even register phase 104 and of the fifth odd register phase 109 are added together in adder 326, the outputs of the third odd register phase 105 and of the fourth even register phase 108 are added together in adder 328, and the outputs of the third even register phase 106 and of the fourth odd register phase 107 are added together in adder 340.

After performing an addition, adder 324 multiplies the result by two by shifting the result one bit to the left in left shifter 360, and provides the same to an adder 350 for addition with another signal representing the result in adder 320, which is provided as a 19 bit sub-product to register 370. The multiplication by two is performed by shifting parallel bits toward the MSB with the LSB filled in with a zero. Thus, a multiplication function is provided which does not require a full clock cycle, providing additional gains in operational speed. Similarly, the output from adder 326 is multiplied by two by left shifter 362 and added to a signal representing the output from the same adder 326 in adder 352 to provide a 19 bit sub-product, which is latched in register 372. The output of the adder 328 is multiplied by four by shifting the bits by two toward the MSB and filling in the two vacated LSBs with zeroes, and added to the output of the same adder 328 in adder 354, to provide a 20 bit sub-product which is provided to a register phase 374. The output of the adder 340 is multiplied by sixteen in left shifter 366 by shifting the output by four bits toward the MSB and filling in the vacated four LSBs and added with the output from the adder 322 in adder 356.

The registered output from singular register phases 370 and 372 are added in adder 380 to provide a 20 bit sub-product to an adder 390, while the registered output from the singular register phases 374 and 376 are added in adder 382 to provide a 23 bit sub-product to adder 390. The 24 bit output from the adder 390 is registered in singular register phase 392.

The precision of the FIR filter 100 is preferably adjustable to maintain only those desired MSBs in the output samples. Thus, the disclosed example includes a right shifter 394 which programmably shifts the registered sub-products from register phase 392 a number of bits to the right, e.g., five (5) or two (2) bits toward the LSB. Thus, if shifting two bits is chosen corresponding to the desired precision, the resultant output sample would be 22 bits. A shifting of five bits toward the LSB in the right shifter 394 would otherwise result in a 19 bit output sample, but preferably the filter design assumes that the output of the precision adjusting right shifter 394 should be as wide as the widest possible sample sub-products that can be chosen at that point, e.g., 22 bits.

A saturation module 396 provides protection against saturated output sample values by replacing overflow values with a maximum value in the respective positive or negative direction. The saturation module 396 outputs the output samples, e.g., having a 16 bit width but at half the rate as the 16 bit samples are input to the FIR filter 100 on sample line 181. Hence, a decimation by ½ is provided by the polyphase FIR filter 100.

Figure 5:
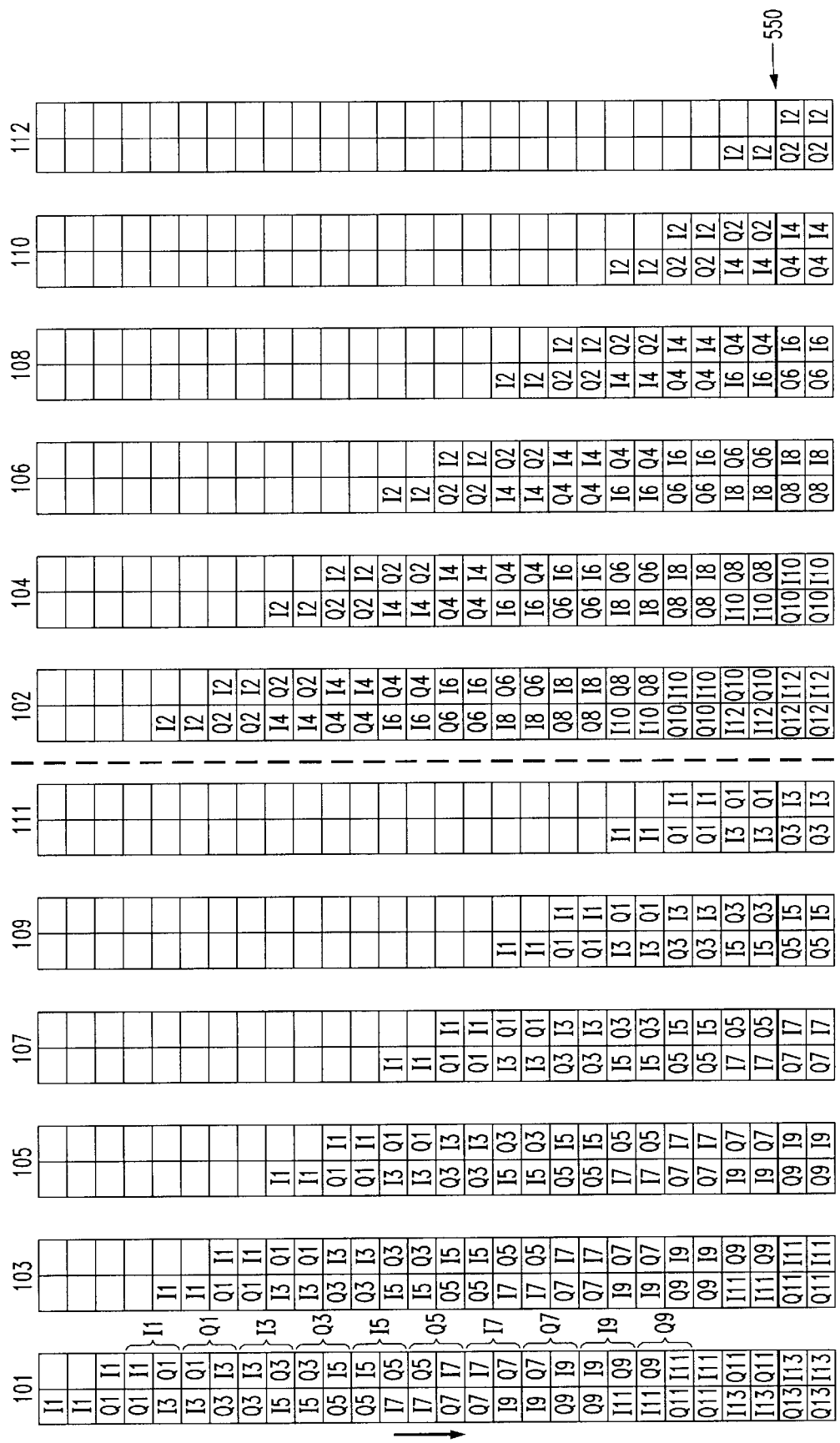
FIG. 5 is a depiction of the contents of the registers in the delay line, in accordance with the principles of the present invention.
Figure 6:
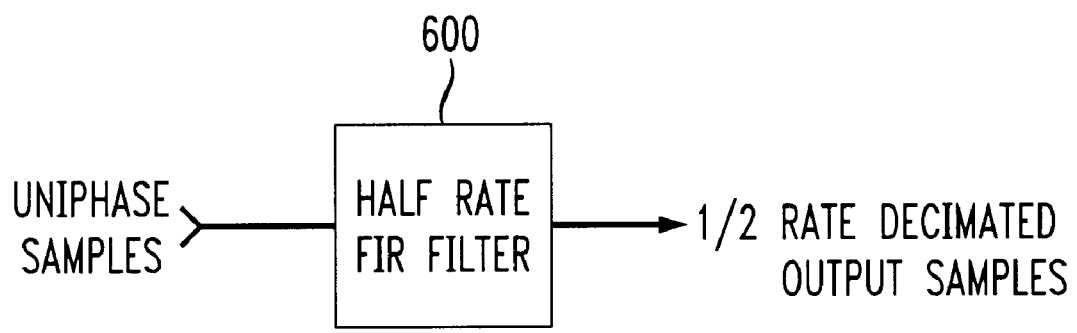
FIG. 6 shows a conventional half rate finite impulse response (FIR) digital filter.
Figure 7:
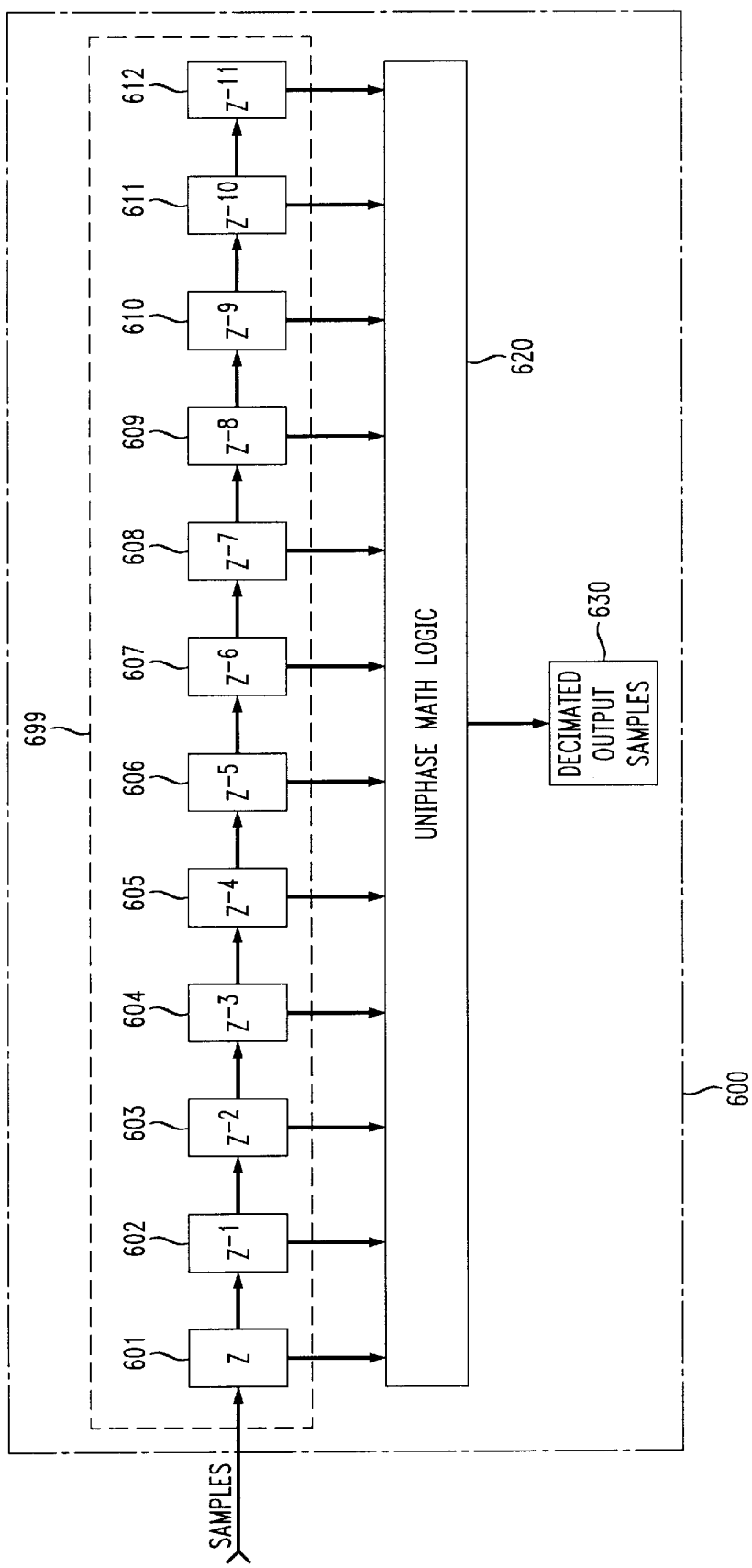
FIG. 7 shows a block diagram of the half rate FIR filter shown in FIG. 6.

FIG. 5 is a depiction of exemplary contents of the twelve register phases 101–112 in the delay line 199 of the embodiment shown in FIGS. 1–4, as samples are presented on the sample line 181.

In particular, the left half of FIG. 5 shows the contents of the six register phases 101, 103, 105, 107, 109 and 111 in the odd delay line 193, while the right half of FIG. 5 shows the contents of the six register phases 102, 104, 106, 108, 110 and 112 in the even delay line 195. The first sample on the sample line 181, e.g., a first sample corresponding to an I phase of a quadrature signal, is retained in the first portion of the register phase 101.

At the preliminary point or startup, there should be a reset to set the appropriate registers to zero, and all initial samples would be valid but small. After twelve samples, the delay line is full and meaningful data is output from the filter.

At this preliminary point in the startup of the FIR filter 100, the remaining register phases contain unknown or zeroed values as indicated in a horizontal direction across the table shown in FIG. 5, and thus the output of the FIR filter 100 is unpredictable. However, after twelve samples relating to each of the two phases of the polyphase sample signal are introduced into the delay line 199, i.e., after point 550, the FIR filter is operable in a normal mode.

While the disclosed embodiments have particular application in the provision of the basis for a digital television (DTV) quadrature amplitude modulation (QAM) demodulator, the principles of the present invention relate equally to the improvement of timing requirements of communications systems in general, particularly those including a digital filter operating on multiple phases of a signal, e.g., cellular telephones and devices utilizing quadrature amplitude modulation (QAM). The present invention uses decreased circuit area and decreased power as compared to conventional devices.

While the invention has been described with reference to the exemplary embodiments thereof, those skilled in the art will be able to make various modifications to the described embodiments of the invention without departing from the true spirit and scope of the invention.

What is claimed is:

1. A decimation filter front end, comprising:
   a first register adapted to delay a first sample from a sample stream;
   a delay circuit in communication with said sample stream;
   a second register adapted to delay a second sample from said sample stream after delay by said delay circuit;
   a first multiplexer circuit adapted to output one of a sample on said sample stream and said delayed first sample based on a control signal; and
   a second multiplexer circuit adapted to output one of a sample delayed by said delay circuit and said delayed second sample based on said control signal.

2. A decimation filter front end, comprising:
   a first register adapted to delay a first sample from a sample stream;
   a delay circuit in communication with said sample stream, said delay circuit comprising two registers in series;
   a second register adapted to delay a second sample from said sample stream after delay by said delay circuit;
   a first multiplexer circuit adapted to output one of a sample on said sample stream and said delayed first sample based on a control signal; and
   a second multiplexer circuit adapted to output one of a sample delayed by said delay circuit and said delayed second sample based on said control signal.

3. A decimation filter front end, comprising:
   a first register adapted to delay a first sample from a sample stream, said sample stream containing I and Q data samples;
   a delay circuit in communication with said sample stream;
   a second register adapted to delay a second sample from said sample stream after delay by said delay circuit;
   a first multiplexer circuit adapted to output one of a sample on said sample stream and said delayed first sample based on a control signal; and
   a second multiplexer circuit adapted to output one of a sample delayed by said delay circuit and said delayed second sample based on said control signal.

4. A decimation filter, comprising:
   a front end comprising:
      a first register adapted to delay a first sample from a sample stream,
      a delay circuit in communication with said sample stream,
      a second register adapted to delay a second sample from said sample stream after delay by said delay circuit,
      a first multiplexer circuit adapted to output one of a sample on said sample stream and said delayed first sample based on a control signal, and
      a second multiplexer circuit adapted to output one of a sample delayed by said delay circuit and said delayed second sample based on said control signal; and
   an odd/even digital delay line operably connected to said first multiplexer circuit and said second multiplexer circuit, said odd/even digital delay line comprising:
      a plurality of register phases,
      a first sub-plurality of every other one of said plurality of register phases receiving a first sample stream, and
      a second sub-plurality of the other every other one of said plurality of register phases receiving a second sample stream; and
   a polyphase math logic module adapted to receive samples from a plurality of tap points along said odd/even digital delay line;
   said odd/even digital delay line alternating in a serial direction between one of odd and even register phases receiving samples from said first sample stream; and
   the other of said odd and even register phases receiving samples from said second sample stream.

5. The decimation filter according to claim 4, wherein:
   said decimation filter provides a finite impulse response filter function.

6. The decimation filter according to claim 4, wherein:
   a decimation of said decimation filter is ½.

7. The decimation filter according to claim 4, wherein:
   a decimation of said decimation filter is $½^n$, where n is a positive integer.

8. The decimation filter according to claim 4, wherein:
   said first sample stream and said second sample stream relate to different phases of a common signal source.

9. The decimation filter according to claim 4, wherein:
   said first sample stream relates to an I component of a quadrature modulation based input signal; and
   said second sample stream relates to a Q component of said quadrature modulation based input signal.

10. The decimation filter according to claim 4, wherein:
    said first sample stream and said second sample stream are deinterlaced when input to said decimation filter.

11. The decimation filter according to claim 4, wherein:
    decimated output samples from said decimation filter are deinterlaced.

12. The decimation filter according to claim 4, wherein:
    first alternating phases of said plurality of register phases are odd register phases with respect to an input to said odd/even digital delay line.

13. The decimation filter according to claim 4, wherein:
    said plurality of tap points are at least twelve tap points.

14. The decimation filter according to claim 4, wherein:
    an input signal to said decimation filter is a quadrature modulation based signal.

15. The decimation filter according to claim 4, wherein:

said first sample stream is provided to a first one of said plurality of register phases; and said second sample stream is provided directly to a second one of said plurality of register phases bypassing said first one of said plurality of register phases.

16. The decimation filter according to claim 4, further comprising:

a shift module adapted to adjust a precision of decimated output samples from said decimation filter.

17. The decimation filter according to claim 4, further comprising:

a saturation module adapted to replace an output sample exceeding one of a predetermined positive maximum and a predetermined negative maximum with a saturation output sample having an appropriate shorter maximum value in an exceeded direction.

18. A method of decimating a polyphase signal, comprising:

generating an even sample stream by multiplexing between a sample stream and a firstly delayed sample stream;

generating an odd sample stream by multiplexing between a secondly delayed sample stream, and a thirdly delayed sample stream;

delaying odd samples in said odd sample stream in a first plurality of serially connected digital register phases;

delaying even samples in said even sample stream in a second plurality of serially connected digital register phases; and alternately filtering said delayed odd samples and said delayed even samples to provide the decimated polyphase signal.

19. The method of decimating the polyphase signal according to claim 18, wherein:

said decimated polyphase signal has a decimation rate of $\frac{1}{2}^n$, where n is a positive integer.

20. The method of decimating the polyphase signal according to claim 18, wherein:

said plurality of phases is two.

21. The method of decimating the polyphase signal according to claim 18, wherein:

said sample stream contains I component samples and Q component samples.

22. The method of decimating the polyphase signal according to claim 21, wherein:

said I component samples are interlaced with said Q component samples.

23. An apparatus for decimating a polyphase signal, comprising:

means for generating an even sample stream by multiplexing between a sample stream and a firstly delayed sample stream;

means for generating an odd sample stream by multiplexing between a secondly delayed sample stream, and a thirdly delayed sample stream;

means for delaying odd samples in said odd sample stream in a first plurality of serially connected digital register phases;

means for delaying even samples in said even sample stream in a second plurality of serially connected digital register phases; and means for alternately filtering said delayed odd samples and said delayed even samples to provide said decimated polyphase signal.

24. The apparatus for decimating the polyphase signal according to claim 23, wherein:

said decimated polyphase signal has a decimation rate of $\frac{1}{2}^n$, where n is a positive integer.

25. The apparatus for decimating the polyphase signal according to claim 23, wherein:

said plurality of phases is two.

26. The apparatus for decimating the polyphase signal according to claim 23, wherein:

said sample stream contains I component samples and Q component samples.

27. The apparatus for decimating the polyphase signal according to claim 26, wherein:

said I component samples are interlaced with said Q component samples.

* * * * *